(12) United States Patent
Mine et al.

(10) Patent No.: US 9,182,464 B2
(45) Date of Patent: Nov. 10, 2015

(54) RETRACTABLE CURRENT LEAD

(75) Inventors: Susumu Mine, Niskayuna, NY (US); Evangelos Trifon Laskaris, Schenectady, NY (US); Paul St. Mark Shadforth Thompson, Stephentown, NY (US)

(73) Assignee: General Electric Company, Niskayuna, NY (US)

( * ) Notice: Subject to any disclaimer, the term of this patent is extended or adjusted under 35 U.S.C. 154(b) by 793 days.

(21) Appl. No.: 13/560,176

(22) Filed: Jul. 27, 2012

(65) Prior Publication Data

US 2014/0028316 A1  Jan. 30, 2014

(51) Int. Cl.
*G01R 33/3815* (2006.01)
*H01F 6/06* (2006.01)

(52) U.S. Cl.
CPC ............ *G01R 33/3815* (2013.01); *H01F 6/065* (2013.01); *Y10T 29/49014* (2015.01)

(58) Field of Classification Search
CPC ..................... G01R 33/3815; Y10T 29/49014; H01F 6/065
See application file for complete search history.

(56) References Cited

U.S. PATENT DOCUMENTS

| | | | |
|---|---|---|---|
| 4,314,123 A | 2/1982 | Hieronymus | |
| 4,453,149 A | 6/1984 | Rios | |
| 4,544,979 A | 10/1985 | Ennis, Jr. et al. | |
| 4,614,393 A | 9/1986 | Laskaris | |
| 4,635,450 A | 1/1987 | Laskaris | |
| 4,813,244 A | 3/1989 | Brzozowski | |
| 5,936,499 A * | 8/1999 | Eckels | 335/216 |
| 8,069,675 B2 * | 12/2011 | Radovinsky et al. | 62/6 |
| 8,291,717 B2 * | 10/2012 | Radovinsky et al. | 62/50.7 |
| 8,374,663 B2 * | 2/2013 | Laskaris et al. | 505/163 |
| 8,729,894 B2 * | 5/2014 | Hollis et al. | 324/307 |
| 2004/0239462 A1 | 12/2004 | Nemoto et al. | |
| 2008/0079428 A1 | 4/2008 | Huang et al. | |
| 2010/0148894 A1 | 6/2010 | Ohashi et al. | |

FOREIGN PATENT DOCUMENTS

| | | | |
|---|---|---|---|
| JP | S61222209 A | 10/1986 | |
| JP | S61222286 A | 10/1986 | |

(Continued)

OTHER PUBLICATIONS

GB Search and Examination Report dated Jan. 14, 2014, issued in connection with corresponding GB Application No. GB1313115.6.

(Continued)

*Primary Examiner* — Dixomara Vargas
(74) *Attorney, Agent, or Firm* — Melissa K. Dobson

(57) ABSTRACT

A current lead assembly for minimizing heat load to a conduction cooled superconducting magnet during a ramp operation is provided. The current lead assembly includes a vacuum chamber having a through hole to enable a retractable current lead having a retractable contact to penetrate within the vacuum chamber. A superconducting magnet is arranged inside of the vacuum chamber and includes a magnet lead. A current contact is arranged inside of the vacuum chamber beneath the through-hole and is coupled to the magnet lead via a thermal connector. The current contact is supported by a thermal isolation support structure coupled to an inside wall of the vacuum chamber. An actuator assembly is provided to contact the retractable contact with the current contact, where connection occurs at ambient temperature inside of the thermal isolation support structure.

20 Claims, 2 Drawing Sheets

(56) References Cited

FOREIGN PATENT DOCUMENTS

Figure 1:
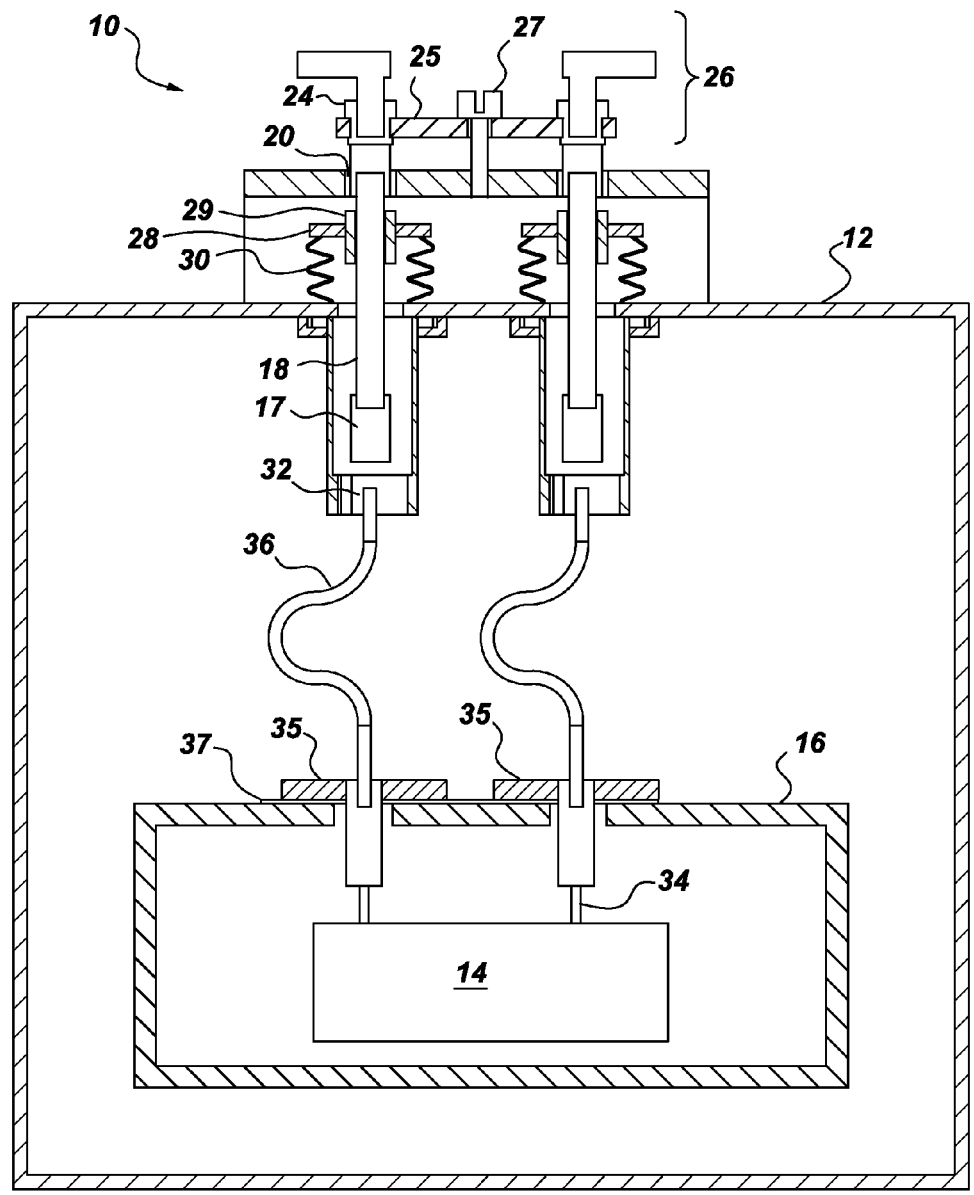

| | | |
|---|---|---|
| JP | H0846254 A | 2/1996 |
| WO | 03002906 A1 | 1/2003 |

OTHER PUBLICATIONS

Y.S, Choi et al., "Semi-Retractable Current Leads for a 21 T FT-ICR Magnet System," IEEE Transactions on Applied Superconductivity, vol. 18, No. 2, pp. 1431-1434, Jun. 2008.

Y. S. Choi et al., "Semi-Retractable Current Lead Cooled by a Cryocooler for High Field Magnet," IEEE Transactions on Applied Superconductivity, vol. 19, No. 3, pp. 2210-2213, Jun. 2009.

Y, S. Choi, "Electrical Contact Resistance of Multi-Contact Connector in Semi-Retractable Current Lead," IEEE Transactions on Applied Superconductivity, vol. 21, No. 3, pp. 1050-1053, Jun. 2011.

"Concept of Semi-Retractable Current Lead," 21 Chem Net, 2 pages, May 9, 2011.

"Semi-Retractable Current Leads for High-field Superconducting Magnets," 21 Chem Net, 2 pages, May 9, 2011.

\* cited by examiner

RETRACTABLE CURRENT LEAD

BACKGROUND

Superconducting magnets conduct electricity with effectively zero resistance as long as the magnets are maintained at a suitably low temperature, which is referred to as a "superconducting temperature" hereinafter. Cryogenic systems are used to ensure that the superconducting magnets work at the superconducting temperature.

Superconducting magnets generally comprise superconducting coils electrically coupled to a power supply through current leads for transmitting electrical current to the superconducting coils. These current leads each include one end electrically coupled to the superconducting coil, and another end electrically coupled to the power supply. The superconducting magnet is coupled to the power supply during a ramp operation to power or charge the magnet to a specified field, then put it into a persistent mode. Cryogenic devices, such as superconducting magnets, may require current ranging from a hundred to several thousand amperes to be brought into the cold region of the cryostat. Significant heat is generated from the current leads that may inevitably propagate to the superconducting coils. Therefore, current leads must be designed to minimize the heat flow or loss into the cold region.

Some current lead assemblies include demountable current leads where the connection to the power supply is terminated when the magnet is powered and placed in persistent mode by disengaging or demounting the contacts of the current leads. The use of demountable current leads in a conduction cooled superconducting magnet system is complicated by the requirement for cooling the current lead that is coupled to the superconducting coils. In a conduction cooled superconducting magnet system, connection of the leads occurs in a vacuum chamber at low temperature, such as 50° K, for example. Electrical contacts made at these low temperatures in a vacuum, typically result in high contact resistance, possibly from frozen contaminants that are deposited to the contacts, as a result of outgassing of the materials in the vacuum. Connection at low temperatures also results in high resistance and high heat load because good contact is difficult to achieve since the contacts are very cold and rigid and have little compliance which makes it difficult to establish electrical contact. Accordingly, the leads serve as a heat load on the superconducting magnet. Therefore, a cooling apparatus typically is used for cooling the end of the current leads that is electrically coupled to the superconducting coils, which is often referred to as a "cold end". The other end that is electrically coupled to the power supply is often referred to as a "warm end". Establishing good electrical connection and minimizing heat load in conduction cooled superconducting magnets continues to be a challenge.

BRIEF DESCRIPTION

A current lead assembly for minimizing heat load to a conduction cooled superconducting magnet during a field ramp operation is provided. The current lead assembly includes a vacuum chamber having a through hole to enable a retractable current lead having a retractable contact to penetrate within the vacuum chamber. A superconducting magnet is arranged inside of the vacuum chamber and includes a magnet lead. A current contact is arranged inside of the vacuum chamber beneath the through-hole and is coupled to the magnet lead via a thermal connector. The current contact is supported by a thermal isolation support structure coupled to an inside wall of the vacuum chamber. An actuator assembly is provided to contact the retractable contact with the current contact, where connection occurs at ambient temperature inside of the thermal isolation support structure.

DRAWINGS

Figure 2:
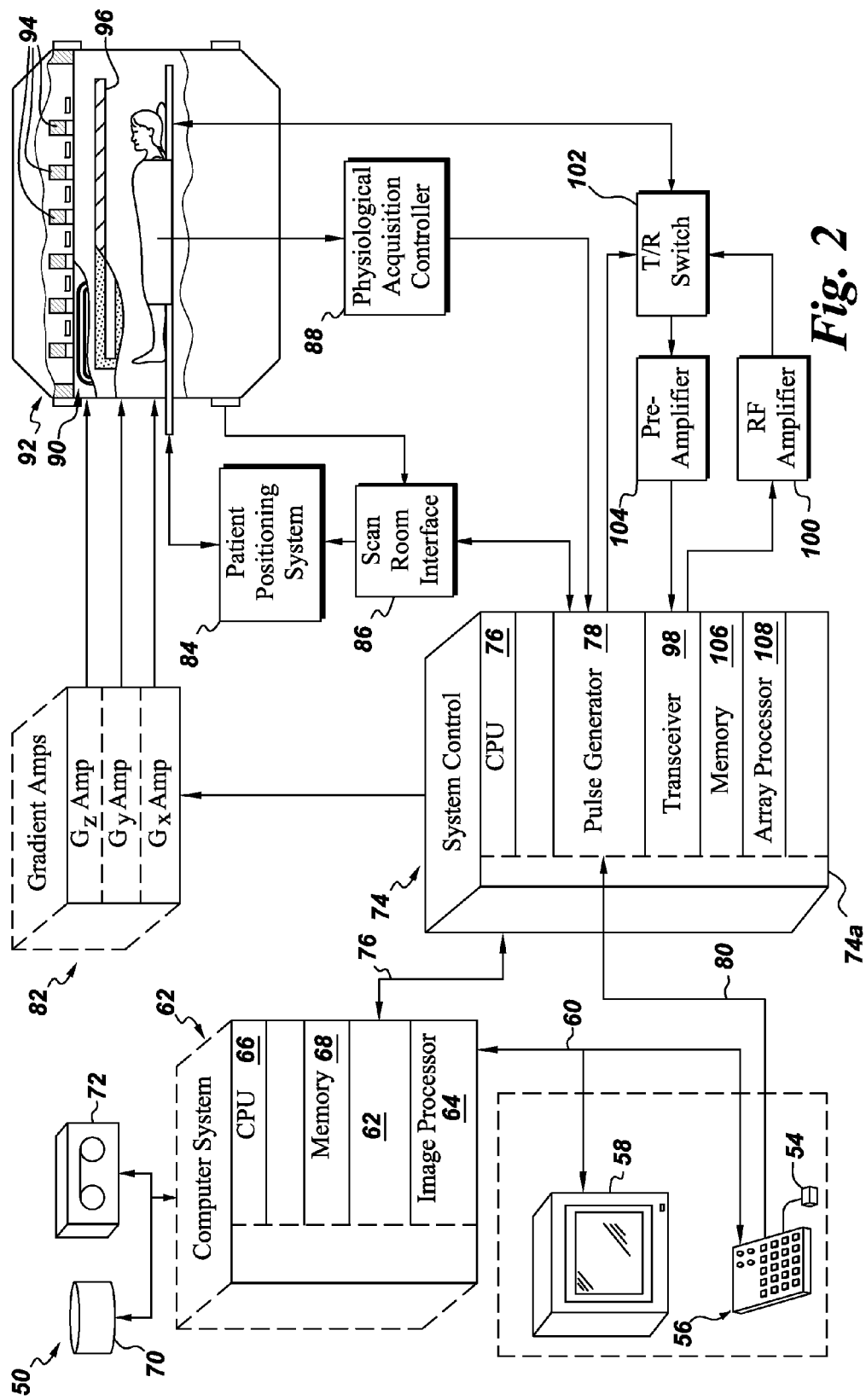

These and other features and aspects of embodiments of the present invention will become better understood when the following detailed description is read with reference to the accompanying drawings in which like characters represent like parts throughout the drawings, wherein:

FIG. 1 is a diagram of a current lead assembly for a superconducting magnet according to an embodiment; and FIG. 2 is a block diagram of an imaging system having a superconducting magnet including the current lead assembly of FIG. 1 according to an embodiment of the invention.

DETAILED DESCRIPTION

Embodiments disclosed herein provide a retractable current lead assembly for a conduction cooled superconducting magnet where connection of the current leads for supplying power to the superconducting magnet occurs at ambient temperature for a period of time, for example, during ramp of the superconducting magnet to field. According to embodiments of the invention, the retractable current lead assembly includes a thermal isolation support structure arranged on an inside wall of a vacuum chamber housing the superconducting magnet. A retractable current lead having a retractable contact penetrates into the thermal isolation support structure, which also supports a current contact that is coupled to a magnet lead of the superconducting magnet via a thermal connector. The retractable current lead is disposed within the thermal isolation support structure via a through hole in the vacuum chamber. The thermal isolation support structure provides an interior that is thermally isolated from the cryogenic temperature of within the vacuum chamber. Therefore, connection of the retractable contact and the current lead occurs at ambient temperature within the thermal isolation support structure. The thermal connector, coupling the current contact and the magnet lead, is selected to minimize the heat load to the superconducting magnet resulting from the thermal conduction between the retractable contact and the current contact in the thermal isolation support structure. Embodiments of the retractable current lead assembly provide for connection at ambient temperature (room temperature for example) to enable a high current ranging from as much as 500 Amps and more to be supplied to the superconducting magnet to ramp the magnet while maintaining minimum heat load to the magnet.

Unless defined otherwise, technical and scientific terms used herein have the same meaning as is commonly understood by one of ordinary skill. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Referring to FIG. 1, a diagram of a current lead assembly according to an embodiment of the invention is shown. While the current lead assembly includes two retractable current leads for operation as shown in FIG. 1, only one side of the retractable current lead assembly will be described for ease of explanation. A vacuum chamber 12 houses a superconducting magnet 14, a thermal shield 16 cooled by a cryocooler (not shown), and a current lead assembly 10. The superconducting magnet 14 is usually cooled to a temperature of about 4K, while the thermal shield is usually cooled to a temperature of about 50K. However, embodiments are not limited to these exemplary temperatures and other temperatures are contemplated.

The current lead assembly 10 includes a retractable current lead 18 that extends into the vacuum chamber 12 via a through-hole 20 in the vacuum chamber 12. The retractable current lead 18 is secured to a cap 22 by a fastener 24. The retractable current lead 18 includes a retractable contact 17. An actuator assembly 26 is provided to retractably engage and disengage the retractable contact. The retractable current lead 18 and retractable contact 17 can be formed as one part (as shown) or separated into multiple parts such as an actuation rod and a contact portion. The actuator assembly 26 can be arranged according to various techniques to enable the retractable current lead 18 to retractably extend into the vacuum chamber 12. In the embodiment shown in FIG. 1, the actuator assembly 26 includes a support rod 25 coupled to the fastener 24 and a screw 27. The screw 27 enables the retractable current lead 18 to engage and disengage the retractable contact 17. A vacuum seal 28 is made between the retractable current lead 18 and bellows 30. The seal 28 contacts the bellows 30 in order to maintain the vacuum within the bellows 30. An insulator 29, such as plastic, can be included to provide electrical insulation between the bellows 30 and the retractable current lead 18. The cap 22 and the bellows 30 are secured together by any suitable technique, such as both welded to vacuum chamber 12, for example.

The current lead assembly 10 also includes a current contact 32 arranged within the vacuum chamber 12. The current contact 32 is coupled to a magnet lead 34 via a thermal connector 36. Thermal stations 35 that receive the thermal connector 36 are secured (e.g., bolted) to the thermal shield 16 through an electrical insulation layer 37. The electrical insulation layer 37 has high thermal conductance so that the temperature of the thermal stations is close to that of the thermal shield 16. Examples of materials for the electrical insulation layer 37 include Kapton with vacuum grease, or filled epoxy with glass. Other suitable materials can be used. The current contact 32 is supported within the vacuum chamber 12 by a thermal isolation support structure 38. The thermal isolation support structure 38 is made of a material that provides thermal isolation while being strong enough to support the current contact 32 and enable high load at connection. Examples of such materials include fiberglass with an epoxy, a plastic insulator such as G10, or other suitable materials. The thermal isolation support structure 38 provides thermal insulation of the current contact 32 from the ambient temperature when the retractable contact 17 is retracted, so that current contact 32 is nearly at the same temperature as the thermal shield 16. Therefore, when the contact or connection between the retractable current lead 18 and the current contact 32 is open, the current contact 32, thermal connector 36, and thermal shield 16, are all maintained at about 50K, thermally insulated from the vacuum vessel at ambient temperature.

The thermal connector 36 is selected to minimize the heat load to the superconducting magnet 14 that results from the connection of the retractable contact 17 with the current contact 32 to power the magnet, even with supply currents of 500 Amps-1000 Amps and more. More particularly, the characteristics of the thermal connector 36 such as material, length, diameter, area, ratio of area to length, for example, are selected to minimize heat conduction. The thermal connector 36 may be a copper or brass cable or wire, for example, and may be rigid or flexible. The thermal connector 36 enables connection to the power supply at ambient temperature with minimal heat load or transfer to the low temperature or superconducting temperature of the superconducting magnet 14.

Superconducting magnets benefit from higher currents because larger superconductor wires are more cost effective in labor and material than smaller wires to fabricate superconducting coils. More particularly, the unit cost of larger wire per ampere meter used for higher current is lower than the smaller wire, which is typically used for lower current such as 100-200 Amps. In addition, fewer turns are required to wind the coil of the magnet. To date, these higher currents are supplied in superconducting magnets that are in a helium vapor or bath environment and not in a vacuum environment. The embodiments disclosed herein enable use of high currents in a vacuum environment for a superconducting magnet by minimizing the heat load to the magnet.

In addition, current lead assemblies in state of the art conduction cooled superconducting magnets make contact at low temperature. Contact at low temperature, such as 50° K and below, results in high resistance and high heat load because good contact is difficult to achieve since the contacts are very cold, rigid, contaminated, and have little compliance which makes it difficult to establish electrical contact. In the embodiments disclosed herein, electrical contact of the magnet to a power supply is made at ambient temperature so that by applying pressure at the contact point a very good electrical contact is established with clean contacts, and very low contact resistance.

More specifically, the thermal isolation provided by the thermal isolation support structure 38 enables the current contact 32 to be maintained either at low temperature, about 50K, when the current lead 18 is retracted, or at ambient temperature when the current contact 17 of the current lead 18 is engaged with contact 32. In addition, the thermal isolation support structure 38 is strong enough to facilitate a high load applied to the contact area. When the retractable current lead 18 is disengaged from the current contact 32, the current contact 32 is cold since it is connected to the magnet 14 via the thermal connector 36 and the magnet lead 34. However, each time contact is established between the retractable current lead 18 and the current contact 32, the current contact 32 warms up to ambient temperature where a good electrical connection occurs and starts conducting heat and electricity. At ambient temperature, any contamination that may have formed as a result of frozen outgassing materials on the current contact 32 disappears as the current contact 32 warms up on contact with the retractable current lead 18. The thermal isolation support structure 38 substantially eliminates any heat load from going into the cryogenic area 15 within the vacuum chamber 12. When contact between the retractable current lead 18 and the current contact 32 is broken, the position of the current contact 32 is maintained by the thermal isolation support structure 38 and the current contact 32 cools down to a cold temperature again. This arrangement enables the retractable current lead 18 and the current contact 32 to be engaged and disengaged without affecting their properties because the contacts occur at ambient temperature.

Referring to FIG. 2, a magnetic resonance imaging (MRI) system is shown incorporating the retractable current lead assembly according to embodiments of the invention. MRI systems typically use superconducting magnets, often with multiple coils to generate the uniform magnetic field. Exemplary superconducting magnet systems operating in MRI systems require occasional ramping of the superconducting magnet to charge the magnet for use of the MRI system. After the superconducting magnet is ramped, the current supply used for the magnet ramping is disconnected and is not needed until further magnet ramping is necessary, such as for demagnetization of the superconducting magnet or for remagnetization of the superconducting magnet after, for instance, scheduled service, a magnet quench, and the like.

The operation of the MRI system 50, shown in FIG. 2, is controlled from an operator console 52 which includes a keyboard or other input device 54, a control panel 56, and a display screen 58. The console 52 communicates through a link 60 with a separate computer system 62 that enables an operator to control the production and display of images on the display screen 58. The computer system 62 includes a number of modules which communicate with each other through a backplane 62*a*. These include an image processor module 64, a CPU module 66 and a memory module 68, known in the art as a frame buffer for storing image data arrays. The computer system 62 is linked to disk storage 70 and removable storage 72 for storage of image data and programs, and communicates with a separate system control 74 through a high speed serial link 76. The input device 54 can include a mouse, joystick, keyboard, track ball, touch activated screen, light wand, voice control, or any similar or equivalent input device, and may be used for interactive geometry prescription.

The system control 74 includes a set of modules connected together by a backplane 74*a*. These include a CPU module 76 and a pulse generator module 78 which connects to the operator console 52 through a serial link 80. It is through link 80 that the system control 74 receives commands from the operator to indicate the scan sequence that is to be performed. The pulse generator module 78 operates the system components to carry out the desired scan sequence and produces data which indicates the timing, strength and shape of the RF pulses produced, and the timing and length of the data acquisition window. The pulse generator module 78 connects to a set of gradient amplifiers 82, to indicate the timing and shape of the gradient pulses that are produced during the scan. The pulse generator module 78 can also receive patient data from a physiological acquisition controller 84 that receives signals from a number of different sensors connected to the patient, such as ECG signals from electrodes attached to the patient. And finally, the pulse generator module 78 connects to a scan room interface circuit 86 which receives signals from various sensors associated with the condition of the patient and the magnet system. It is also through the scan room interface circuit 86 that a patient positioning system 88 receives commands to move the patient to the desired position for the scan.

The gradient waveforms produced by the pulse generator module 78 are applied to the gradient amplifier system 82 having Gx, Gy, and Gz amplifiers. Each gradient amplifier excites a corresponding physical gradient coil in a gradient coil assembly generally designated 90 to produce the magnetic field gradients used for spatially encoding acquired signals. The gradient coil assembly 90 forms part of a magnet assembly 92 which includes a polarizing magnet 94 and a whole-body RF coil 96. A transceiver module 98 in the system control 74 produces pulses which are amplified by an RF amplifier 100 and coupled to the RF coil 96 by a transmit/receive switch 102. The resulting signals emitted by the excited nuclei in the patient may be sensed by the same RF coil 96 and coupled through the transmit/receive switch 102 to a preamplifier 104. The amplified MR signals are demodulated, filtered, and digitized in the receiver section of the transceiver 98. The transmit/receive switch 102 is controlled by a signal from the pulse generator module 78 to electrically connect the RF amplifier 100 to the coil 96 during the transmit mode and to connect the preamplifier 104 to the coil 96 during the receive mode. The transmit/receive switch 102 can also enable a separate RF coil (for example, a surface coil) to be used in either the transmit or receive mode.

The MR signals picked up by the RF coil 96 are digitized by the transceiver module 98 and transferred to a memory module 106 in the system control 74. A scan is complete when an array of raw k-space data has been acquired in the memory module 106. This raw k-space data is rearranged into separate k-space data arrays for each image to be reconstructed, and each of these is input to an array processor 108 which operates to Fourier transform the data into an array of image data. This image data is conveyed through the serial link 76 to the computer system 62 where it is stored in memory, such as disk storage 70. In response to commands received from the operator console 52, this image data may be archived in long term storage, such as on the removable storage 72, or it may be further processed by the image processor 64*f* and conveyed to the operator console 52 and presented on the display 58.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A current lead assembly for a superconducting magnet, comprising:
   a vacuum chamber having a through hole;
   a superconducting magnet arranged inside of the vacuum chamber and having a magnet lead;
   a current contact arranged inside of the vacuum chamber beneath the through-hole;
   a thermal connector having one end coupled to the magnet lead and another end coupled to the current contact;
   a thermal isolation support structure coupled to an inside wall of the vacuum chamber to support the current contact beneath the through-hole;
   a retractable current lead sealably penetrating the vacuum chamber via the through hole and having a retractable contact; and
   an actuator assembly, coupled to the vacuum chamber and the retractable current lead, arranged to contact the retractable contact with the current contact, wherein the contact occurs at ambient temperature inside of the thermal isolation support structure.

2. The current lead assembly of claim 1, wherein the actuator assembly is arranged to separate the retractable contact of the retractable current lead from the current contact upon completion of a magnet ramp operation.

3. The current lead assembly of claim 1, wherein the thermal connector is arranged to minimize heat conduction to the magnet lead resulting from the contact of the retractable contact and the current contact.

4. The current lead assembly of claim 1, wherein the thermal connector is flexible.

5. The current lead assembly of claim 1, wherein the thermal connector is a flexible copper cable.

6. The current lead assembly of claim 1, wherein the retractable contact, the thermal connector, and the current contact comprise a thermally conductive material.

7. The current lead assembly of claim 6, wherein the thermally conductive material is copper.

8. The current lead assembly of claim 1, wherein the retractable contact is integral to the retractable current lead.

9. The current lead assembly of claim 1, wherein the thermal isolation support structure comprises a thermal insulating material.

10. The current lead assembly of claim 9, wherein the thermal insulating material is fiberglass.

11. The current lead assembly of claim 1, wherein the thermal isolation support structure provides thermal isolation of the retractable contact.

12. The current lead assembly of claim 11, wherein the thermal isolation support structure maintains an ambient temperature of the retractable contact.

13. The current lead assembly of claim 1, wherein an end of the retractable current lead is coupled to a power supply, and wherein a current in a range from 500 amperes to at least 1000 amperes is supplied to the superconducting magnet via connection of the retractable contact with the current contact.

14. A method of fabricating a current lead assembly for superconducting magnet, comprising:
   providing a vacuum chamber comprising a housing enclosing an interior volume and having a through-hole;
   providing a superconducting magnet inside of the vacuum chamber and having a magnet lead;
   arranging a current contact inside of the vacuum chamber beneath the through-hole;
   attaching a thermal connector between the magnet lead and the current contact;
   attaching a thermal isolation support structure to an inside wall of the vacuum chamber to support the current contact beneath the through-hole;
   arranging a retractable current lead having a retractable contact to sealingly penetrate the vacuum chamber via the through hole; and
   connecting an actuator assembly to the vacuum chamber and the retractable current lead to contact the retractable contact with the current contact, wherein the contact occurs at ambient temperature outside of the vacuum chamber.

15. The method of claim 14, further comprising:
   arranging the actuator assembly to separate the retractable contact of the retractable current lead from the current contact upon completion of the activation mode.

16. The method of claim 14, further comprising:
   selecting the thermal connector to minimize heat conduction to the magnet lead resulting from the contact of the retractable contact and the current contact.

17. The method of claim 14, further comprising:
   thermally isolating the retractable contact from the interior volume of the vacuum chamber.

18. A magnetic resonance imaging (MRI) system, comprising:
   a vacuum chamber enclosing a vacuum space and comprising a through-hole;
   a superconducting magnet arranged inside of the vacuum chamber and having a magnet lead;
   a current contact arranged inside of the vacuum chamber beneath the through-hole;
   a thermal connector having one end coupled to the magnet lead and another end coupled to the current contact;
   a thermal isolation support structure coupled to an inside wall of the vacuum chamber to support the current contact beneath the through-hole;
   a retractable current lead sealably penetrating the vacuum chamber via the through hole and having a retractable contact; and
   an actuator assembly, coupled to the vacuum chamber and the retractable current lead, arranged to contact the retractable contact with the current, wherein the contact occurs at ambient temperature.

19. The MRI system current lead assembly of claim 18, wherein the actuator assembly is arranged to separate the retractable contact of the retractable lead from the current contact upon completion of the activation mode.

20. The MRI system of claim 18, wherein the thermal connector is arranged to minimize heat conduction to the magnet lead resulting from the contact of the retractable contact and the current contact.

* * * * *